(12) United States Patent
Kataoka

(10) Patent No.: US 6,838,686 B2
(45) Date of Patent: Jan. 4, 2005

(54) ALIGNMENT METHOD AND EXPOSURE APPARATUS USING THE METHOD

(75) Inventor: Yoshiharu Kataoka, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 82 days.

(21) Appl. No.: 09/946,486

(22) Filed: Sep. 6, 2001

(65) Prior Publication Data

US 2002/0034831 A1 Mar. 21, 2002

(30) Foreign Application Priority Data

Sep. 21, 2000 (JP) .......................................... 2000-286749
Aug. 14, 2001 (JP) .......................................... 2001-246219

(51) Int. Cl.[7] ........................... G21N 5/10; G01J 21/86; H01J 37/08
(52) U.S. Cl. .................................. 250/492.22; 250/548
(58) Field of Search ........................ 275/797; 250/492.22, 250/548; 257/97

(56) References Cited

U.S. PATENT DOCUMENTS

| | | | | |
|---|---|---|---|---|
| 4,769,680 A | * | 9/1988 | Resor et al. ................... | 355/43 |
| 5,403,754 A | * | 4/1995 | Jackson ....................... | 438/16 |
| 5,751,428 A |   | 5/1998 | Kataoka et al. ............. | 356/401 |
| 5,783,341 A |   | 7/1998 | Uzawa ......................... | 430/22 |
| 5,835,196 A | * | 11/1998 | Jackson ....................... | 355/53 |
| 5,945,239 A | * | 8/1999 | Taniguchi ..................... | 430/30 |
| 5,998,226 A | * | 12/1999 | Chan ............................ | 438/10 |
| 6,416,912 B1 | * | 7/2002 | Kobayashi et al. .......... | 430/22 |
| 6,590,637 B2 | * | 7/2003 | Nishi ........................... | 355/53 |
| 2002/0014601 A1 | * | 2/2002 | Yoshida ....................... | 250/548 |

FOREIGN PATENT DOCUMENTS

JP    7-321012    12/1995

* cited by examiner

Primary Examiner—Chandra Chaudhari
Assistant Examiner—William C. Vesperman
(74) Attorney, Agent, or Firm—Fitzpatrick, Cella, Harper & Scinto

(57) ABSTRACT

A method for aligning existing layers formed prior to a new layer and the new layer in forming the new layer on a wafer 4, wherein a microscope 6 as a first measurement condition and a microscope 7 as a second measurement condition are used, and marks 4a and 4b formed in each of said existing layers are measured by switching the first and second conditions, and said existing layers and said new layer are aligned based on measurement of mark position of each of said existing layers, and the microscope 7 has a plurality of measurement conditions as optical characteristics, and the measurement conditions are switched.

7 Claims, 11 Drawing Sheets

FIG. 10

```
URL  http://www.maintain.co.jp/db/input.html

TROUBLE DB INPUT PICTURE

DAY OF OCCURRENCE  [2000/3/15]~404
MACHINE-TYPE       [* * * * * * * * *]~401
TITLE OF TROUBLE   [MALFUNCTION (ERROR IN START-UP)]~403
APPARATUS S/N      [465NS4580001]~402
DEGREE OF EMERGENCY [D]~405

SYMPTOM  [LED FLASHES AFTER POWER
          SUPPLY TURNED ON          ]~406

MEASURE  [RETRY TO TURN POWER SUPPLY ON
          (PUSH THE RED BUTTON DOWN IN START-UP)]~407

HISTORY  [TEMPORARY MEASURE TAKEN    ]~408

[FORWARD] [RESET]   410              411              412
LINK TO RESULT LOOK-UP DATABASE  SOFTWARE LIBRARY  OPERATION GUIDE
```

SEMICONDUCTOR DEVICE MANUFACTURING FLOW

ALIGNMENT METHOD AND EXPOSURE APPARATUS USING THE METHOD

FIELD OF THE INVENTION

The present invention relates to an alignment method and an exposure apparatus using the method, and particularly is suitable for an alignment method in semiconductor manufacturing and method and apparatuses for manufacturing devices using it.

BACKGROUND OF THE INVENTION

Currently, in semiconductor manufacturing, a semiconductor device is fabricated by depositing multiple layers successively. In actual semiconductor manufacturing, a method is known wherein instead of measuring positions of alignment marks formed in a layer prior to exposure, marks are formed in the multiple layers and alignment is performed by measuring positions of the marks in the multiple layers.

As described in Japanese Patent Laid-Open No. 7-321012, it is suggested that when forming a layer on a substrate the layer is formed after measuring positions of marks formed in each of at least two layers formed prior to the layer, based on measurement of the mark positions in each of said layers.

In the past, there has been a problem that in measuring alignment marks formed in each layer the measurement accuracy is degraded due to manufacturing processes such as physical feature and resist application condition of each alignment mark.

SUMMARY OF THE INVENTION

It is an object of the present invention to provide an alignment method and an exposure apparatus using the method wherein high accuracy alignment is provided by switching measurement conditions or measurement parts for the alignment in measuring alignment marks formed in each layer.

In order to achieve the object above described, an alignment method of the present invention is a method wherein when forming a new layer on a substrate, alignment is performed by measuring each position of existing layers formed prior to the above described new layer and the above described new layer in a first measurement condition or a second measurement condition, comprising the steps of: measuring by switching between the above described first and second measurement conditions for marks formed in each of the above described existing layers; and performing alignment between the above described existing layers and the above described new layer based on measurement of mark positions of the above described existing layers.

Preferably, the above described second measurement condition has a plurality of different conditions in an optical characteristic, and the measurement is performed by switching the measurement conditions. As the optical characteristic preferably wavelength of illumination light for the measurement is switched. As the above described optical characteristic values representing light intensity distribution of illumination light for the measurement (σ=standard deviation) may be switched.

The present invention includes an exposure apparatus for using any of the above described alignment method and forming the above described new layer.

The exposure apparatus according to the present invention is an apparatus wherein an exposed object is aligned based on measurement of position information on marks formed in each of existing layers on the exposed object on which the existing layers are provided and a new layer is to be formed, and then projection exposure is performed, the apparatus having a first measurement part and a second measurement part for measuring the position information on marks, the above described first and second measurement parts being configured such that they can be switched for the marks formed in each of the above described existing layers.

It is preferred that the above described first and second measurement parts are switched manually, or that switching of the above described first and second measurement parts are performed based on automatic calculation of contrast that is made before exposure.

An exposure method of the present invention is a method for aligning an exposed object having a plurality of existing layers with alignment marks formed in each of them based on measurement of the alignment marks, and projection-exposing the object, wherein when measuring the alignment marks in the above described each layer, each alignment mark is measured by switching conditions of illumination light for the measurement depending on the particular alignment mark in each layer.

The present invention can also be applied to a semiconductor device manufacturing comprising the steps of: installing in a semiconductor manufacturing factory a manufacturing apparatuses for various processes including the above described exposure apparatus; and manufacturing semiconductor devices by a plurality of processes with the manufacturing apparatuses. The semiconductor device manufacturing method may be also characterized in that it further comprises the steps of: connecting the above described manufacturing apparatuses by a local area network; and data-communicating information about at least the above described manufacturing apparatuses of the above described manufacturing apparatuses between the above described local area network and an external network outside the above described semiconductor manufacturing factory, characterized in that maintenance information for the above described exposure apparatus is obtained by accessing and communicating data with a database provided by a vender or user of the above described exposure apparatus via the above described external network, or production control is conducted by communicating data via the above described external network between the above described semiconductor manufacturing factory and a semiconductor manufacturing factory other than the above described semiconductor manufacturing factory.

The present invention may be applied to a semiconductor manufacturing factory comprising: a group of manufacturing apparatuses for various processes including the above described exposure apparatuses; a local area network for connecting the manufacturing apparatuses; and a gateway allowing access by the local area network to an external network outside of the factory, wherein data communication of information about at least one apparatus of the above described manufacturing apparatuses is provided, and the present invention can be applied to a maintenance method for a exposure apparatus installed in a semiconductor manufacturing factory comprising the steps of: a user or vender of the above described exposure apparatus providing a maintenance database connected to an external network for the semiconductor manufacturing factory; allowing access from inside of the above described semiconductor manufacturing factory via the above described external network to the above described maintenance database; and transmitting maintenance information stored in the above described maintenance database via the above described external network to the semiconductor manufacturing factory side.

The present invention may also be characterized in that the above described exposure apparatus further comprises a display, a network interface, and a computer for executing software for the network, wherein data-communication of maintenance information on the exposure apparatus via a computer network is provided, and preferably, the software for the network provides on the above described display a user interface connected to an external network for a factory with the above described exposure apparatus installed therein, for accessing a maintenance database provided by a vender or user of the above described exposure apparatus, whereby allowing acquisition of information from the database via the above described external network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 10 shows a specific example of a user interface;

Other objects and advantages besides those discussed above shall be apparent to those skilled in the art from the description of a preferred embodiment of the invention which follows. In the description, reference is made to accompanying drawings, which form apart thereof, and which illustrate an example of the invention. Such example, however, is not exhaustive of the various embodiments of the invention, and therefore reference is made to the claims which follow the description for determining the scope of the invention.

DETAILED DESCRIPTION OF THE PREFERRED EMBODIMENTS

An alignment method according to an embodiment of the present invention switches measurement conditions or measurement parts in measuring alignment marks formed in each layer.

In the past, in exposure apparatus, as a measurement mechanism for alignment marks to obtain information about position in a wafer surface, there are known Off-Axis mechanism wherein non-exposure light is used and does not pass any projection lens, and non-exposure TTL (Through The Lens) mechanism wherein non-exposure light is used and passes a projection lens.

Particularly, multiple wavelengths are recently used as illumination light for observation in order to improve detection accuracy for AA mark observation images. For example, the use of a light source with relatively wide wavelength width by a halogen lamp (633±30 nm, for example) as illumination light for observing non-exposure light is characterized in that interference fringe by resist film, which tends to occur when observing an AA mark on a wafer by using monochromatic light source such as He—Ne laser, can be reduced, thereby providing better alignment.

There is also a method to improve the interference conditions by varying the center wavelength of illumination light.

It is also possible to vary illumination conditions for He—Ne laser, for example, conditions for a value representing light intensity distribution of illumination (σ=standard deviation).

Thus, in order to support processes that vary for each layer each alignment mark is measured by switching conditions of illumination light optimized for alignment marks in each layer when measuring alignment marks in each layer.

Various embodiments will be now described with reference to the drawings.

[First Embodiment]

Figure 1:
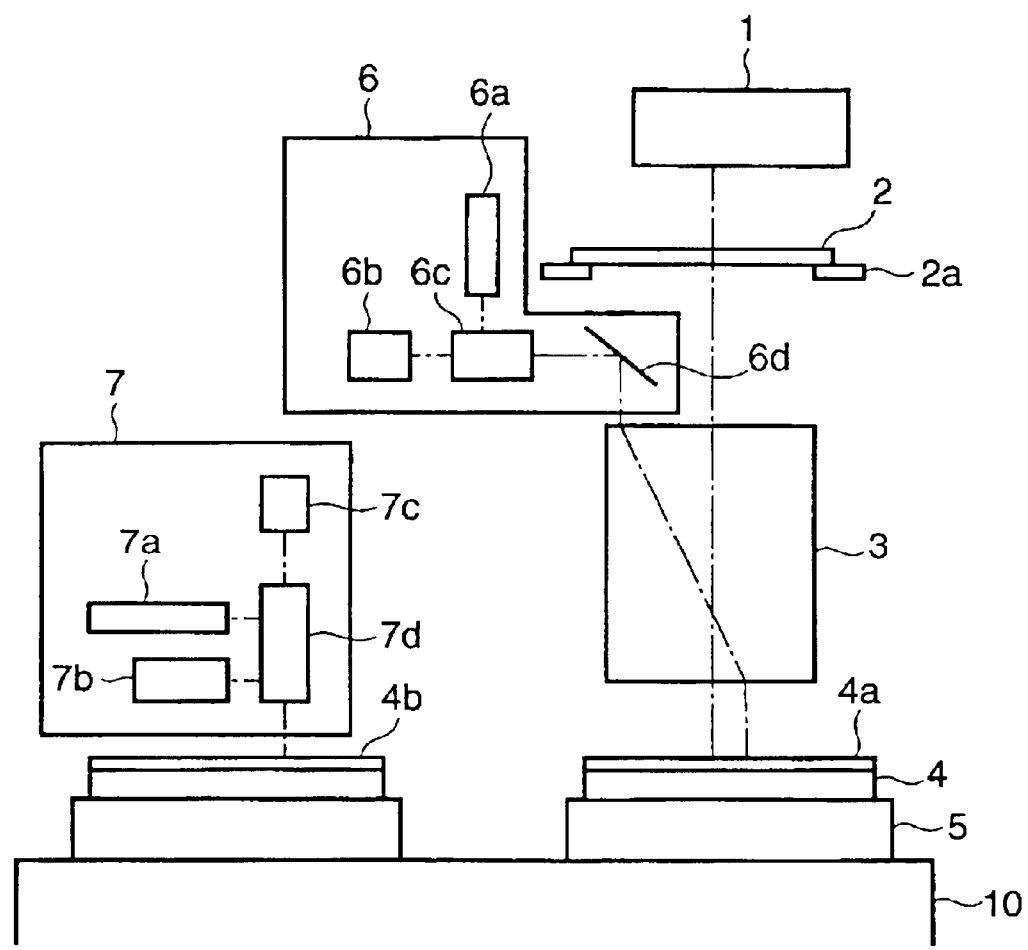
FIG. 1 is a block diagram showing an exposure apparatus comprising an alignment device including a non-exposure TTL mechanism and an Off-Axis mechanism according to an embodiment of the invention.

FIG. 1 shows an exposure apparatus comprising an alignment device including non-exposure TTL mechanism and Off-Axis mechanism, according to a first embodiment of the present invention.

As shown in FIG. 1, light from a light source emitted by illumination system 1 irradiates a reticle 2 as a first object. Patterns on a surface of the reticle 2 are projection-transferred onto a wafer 4 as a second object by a projection optical system 3. The wafer 4 is fixed onto a movable stage 5 disposed on a base plate 10. The reticle 2 is hold on a reticle stage 2a, and the reticle stage 2a is moved in X, Y, Z, and θ directions by means of a reticle drive mechanism (not shown).

On the wafer 4, a plurality of alignment marks 4a and 4b have been formed in existing layers until the last process step, which marks are located in certain positional relationship with respect to circuit patterns. Reference numeral 6 denotes a microscope with TTL mechanism as a first measurement condition or measurement part. The TTL microscope 6 is a microscope that reads the alignment mark 4a on the wafer 4 through lenses of the projection optical system 3, and performs position measurement for the alignment mark 4a on the wafer 4 by a mirror 6d located between the reticle 2 and the projection optical system 3. Reference numeral 6a denotes an illumination light source with He—Ne laser, and reference numeral 6b is a CCD camera. The illumination light emitted by the illumination light source 6a is transmitted by an alignment optical system 6c and mirror 6d disposed between the reticle 2 and projection optical system 3, through lenses in the projection optical system 3, thereby illuminating alignment mark regions on the wafer 4.

Light reflected or scattered on the wafer 4 based on the alignment mark 4a is transmitted again the lenses in the projection optical system 3, by the mirror 6d and alignment optical system 6c, then is imaged on the CCD camera 6b.

The CCD camera 6b processes the image of the alignment mark 4a to obtain position information on the wafer 4.

Reference numeral 7 denotes an Off-Axis microscope as a second measurement condition or measurement part, which microscope has two measurement methods. It is placed at a position other than the TTL type microscope 6 and measures an alignment mark 4b formed at a position in certain positional relationship with respect to exposed position. Reference numeral 7a denotes a first illumination light source with He—Ne laser used in a first measurement method, and reference numeral 7b denotes an illumination light source with a halogen lamp used in a second measurement method, and reference numeral 7c denotes a CCD camera. One of these two light sources 7a and 7b used in the first and second measurement methods is selected as a light source, and illumination light from the light source illuminates an alignment mark region on the wafer 4 through an alignment optical system 7d without passing the projection optical system 3.

The light reflected or scattered on the surface of the wafer 4 is again imaged through the alignment optical system 7d on the CCD camera 7c. The position information is measured by image-processing with the CCD camera 7c.

Figure 2A:
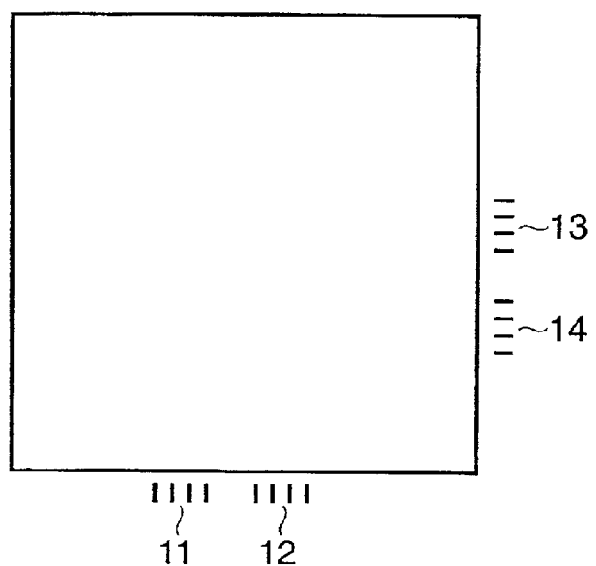
FIG. 2A is a plan view of in-shot arrangement for alignment marks according to an embodiment of the present invention.
Figure 2B:
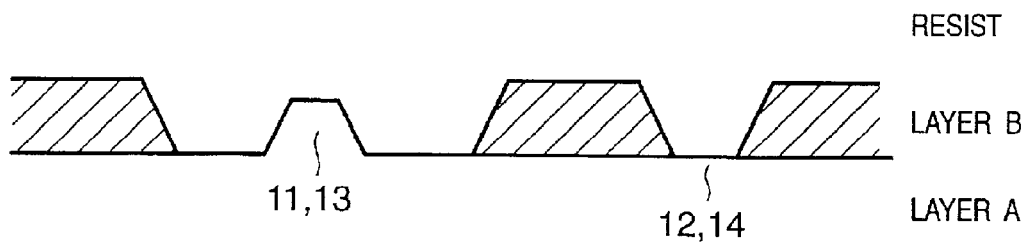
FIG. 2B shows a step formation for the alignment marks.

FIGS. 2A and 2B show examples for arrangements of alignment marks of this embodiment. FIG. 2A shows an in-shot plan arrangement, and FIG. 2B shows a step formation of the alignment marks. Reference numerals 11 and 13 denote alignment marks formed in layer A, and reference numerals 12 and 14 denote alignment marks formed in layer B.

Figure 3:
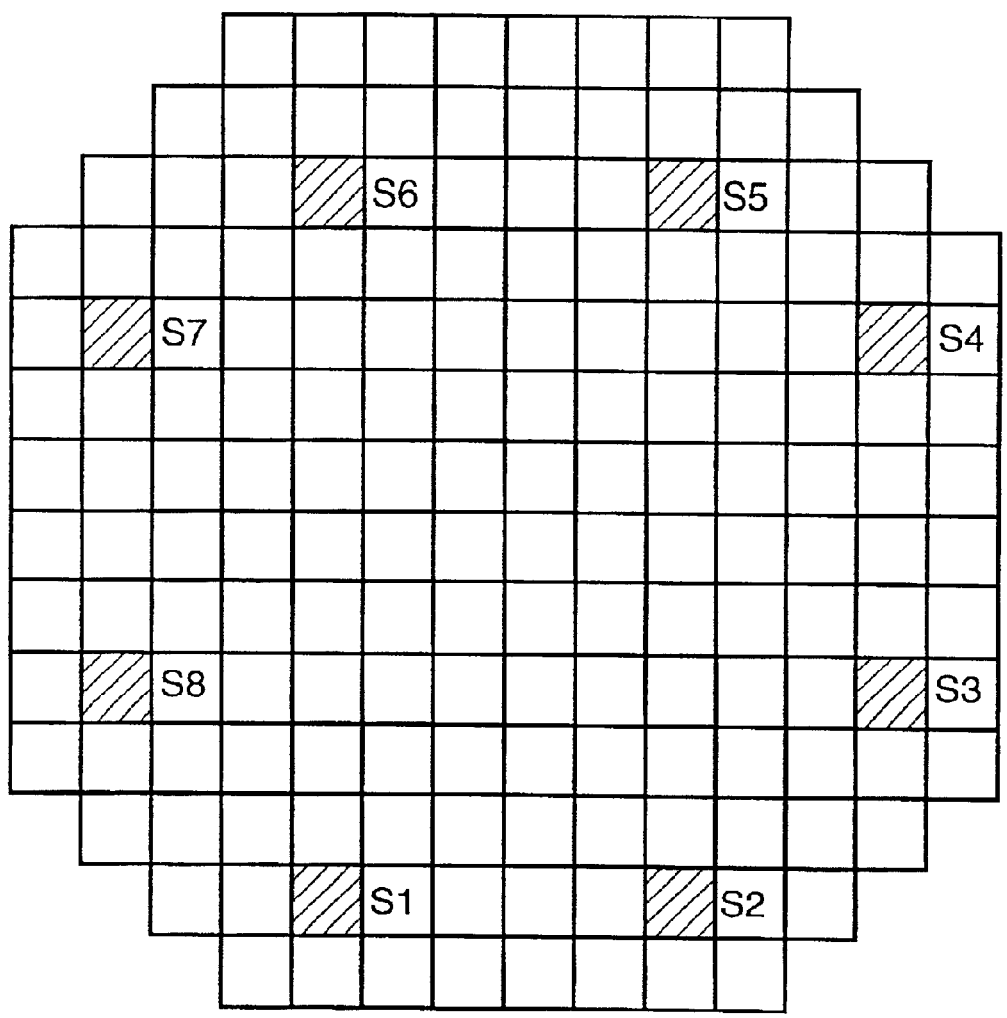
FIG. 3 shows measurement shots in global alignment according to an embodiment of the present invention.
Figure 4:
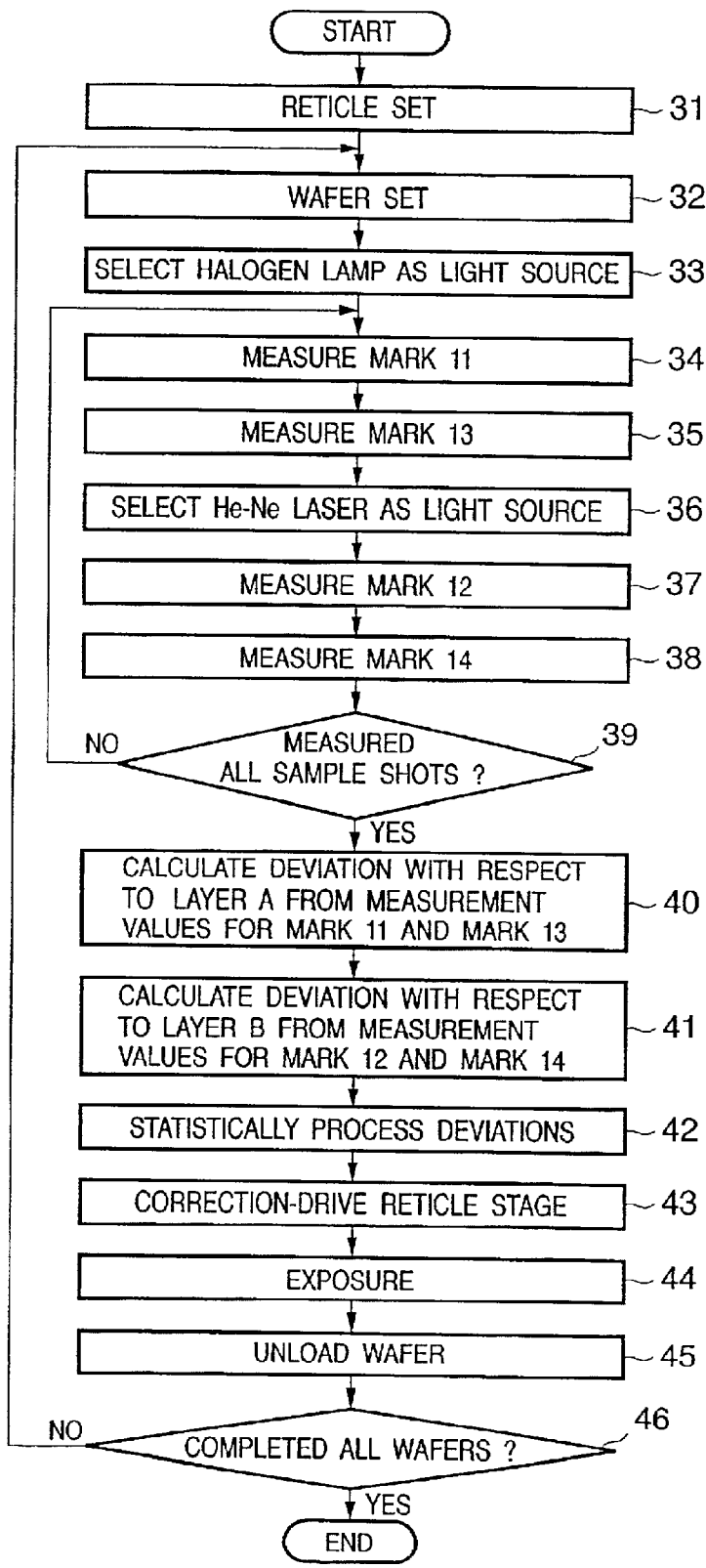
FIG. 4 shows a measurement/exposure sequence according to an embodiment of the present invention.

FIG. 3 shows an example of arrangement for measurement shots S1 to S8 in global alignment, and FIG. 4 shows a measurement/exposure sequence in the example. After selecting a reticle set at step 31, a wafer set at step 32, and a halogen lamp as the light source at step 33, at first using the Off-Axis microscope 7 while halogen lamp 7b with wide wavelength band is being set as the light source, alignment mark 11 formed in layer A shown in FIGS. 2A and 2B is measured at step 34, and alignment mark 13 formed in layer A shown in FIGS. 2A and 2B is measured at step 35. Next, after selecting He—Ne laser light as the light source at step 36, while the He—Ne laser light 7a is being set as the light source the alignment mark 12 formed in layer B is measured at step 37 and the alignment mark 14 is measured at step 38.

Determination is made if all sample shots have been measured at step 39, so that the measurements above described are repeated until measurement of all sample shots is completed. Upon completion of measurement of all sample shots, deviations of the reticle with respect to layer A is calculated from measurements of the mark 11 and mark 13 at step 40, and deviations of the reticle with respect to layer B is calculated from measurements of the mark 12 and the mark 14 at step 41. After statistically processing the amount of the deviations at step 42, and correction-driving the reticle stage at step 43, exposure is performed at step 44, and the after is unloaded at step 45, and determination is made if the process is completed for the whole wafer at step 46, and if the process is not completed for the whole wafer, then the processes above described are repeated starting with the wafer setting at step 32.

For example, measurement conditions or measurement parts are predetermined such that for each mark, switching of light sources such as He—Ne laser and halogen lamp, as the measurement conditions or measurement parts, provides respective waveforms of the marks detected by the CCD camera with good contrast, and a manual switching part is provided such that the measurement conditions or measurement parts can be set in the apparatus side.

[Second Embodiment]

In a second embodiment of the present invention, a TTL mechanism and an Off-Axis mechanism can be switched as measurement conditions or measurement parts, and a wavelength filter for varying the center wavelength of a halogen lamp may be formed as a measurement method.

It is also possible to switch values representing light intensity distribution condition of illumination by He—Ne laser light ($\sigma$=standard deviation, not shown) and change them.

As the first embodiment, measurement conditions or measurement parts are predetermined such that for each mark, switching of TTL mechanism and Off-Axis mechanism, switching of center wavelengths of the halogen lamp, or switching of $\sigma$s, as the measurement conditions or measurement parts, provides waveforms for the marks with good contrast, and a manual switching part is provided such that the measurement conditions or measurement parts can be set in the apparatus side. It is also possible to automatically calculate the contrast and determine for each mark an optimized measurement condition or measurement part, or a wavelength and $\sigma$.

In measurement of wafer position it is needed to set an optimized illumination condition since reflection, absorption, scattering, diffraction and interference of the illumination light affect the measurement of the wafer position depending on physical feature of the alignment marks and manufacturing process such as application condition of resist.

[Third Embodiment]

In a third embodiment of the present invention, it is possible to automatically switch measurement conditions for each marks formed in the wafer right after starting each lot processing and automatically calculate contrast to determine an optimized measurement condition or measurement part for each mark.

Figure 6A:
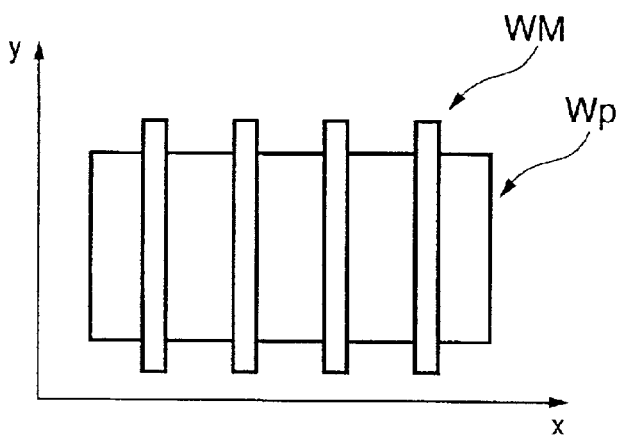
FIG. 6A shows an alignment mark image and a process window.

As shown in FIG. 6A, the mark is composed of four rectangular portions having same geometry. As described for the first embodiment, light flux reflected by the alignment mark transmits the lenses of the projection optical system 3 through the alignment optical system, then forms an alignment mark image WM on the CCD camera.

Figure 6B:
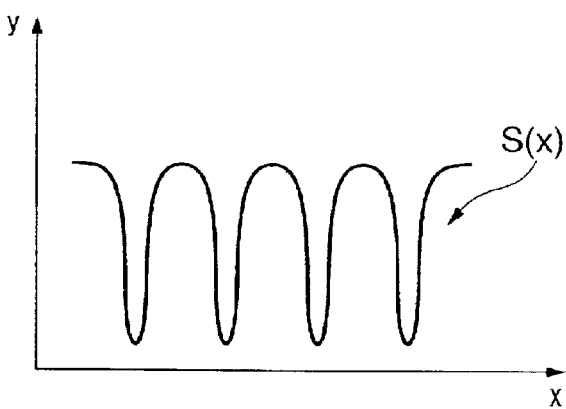
FIG. 6B shows a one-dimensional digital signal sequence, to which a two-dimensional image signal is converted, obtained by setting the alignment mark image and the process window.

It is subject to photo-electric conversion in the CCD camera, then converted to two-dimension digital signal sequence in an A/D conversion device (not shown). Then, a process window Wp is set for the digital signal conversion, as shown in FIGS. 6A and 6B, and the two-dimension image signal is converted to a one-dimension digital signal sequence S(x) by add process in y-direction.

Figure 7A:
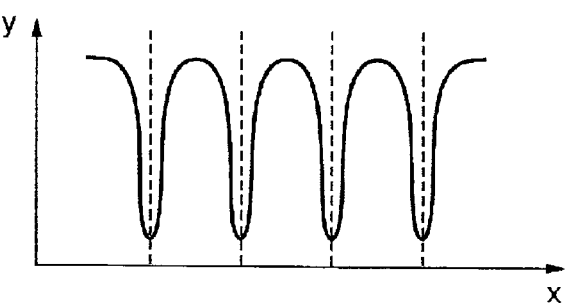
FIG. 7A shows an image signal with high contrast.
Figure 7B:
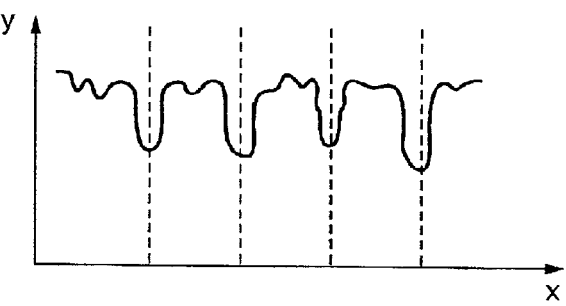
FIG. 7B shows an image signal with low contrast.

The contrast is changed for each mark, as shown in FIGS. 7A and 7B, by switching the alignment measurement conditions, for example, by switching light sources such as a halogen lamp or He—Ne laser, or by switching light intensity distribution conditions a for He—Ne laser light. FIG. 7A shows an image signal with high contrast while FIG. 7B shows an image signal with low contrast.

Figure 5:
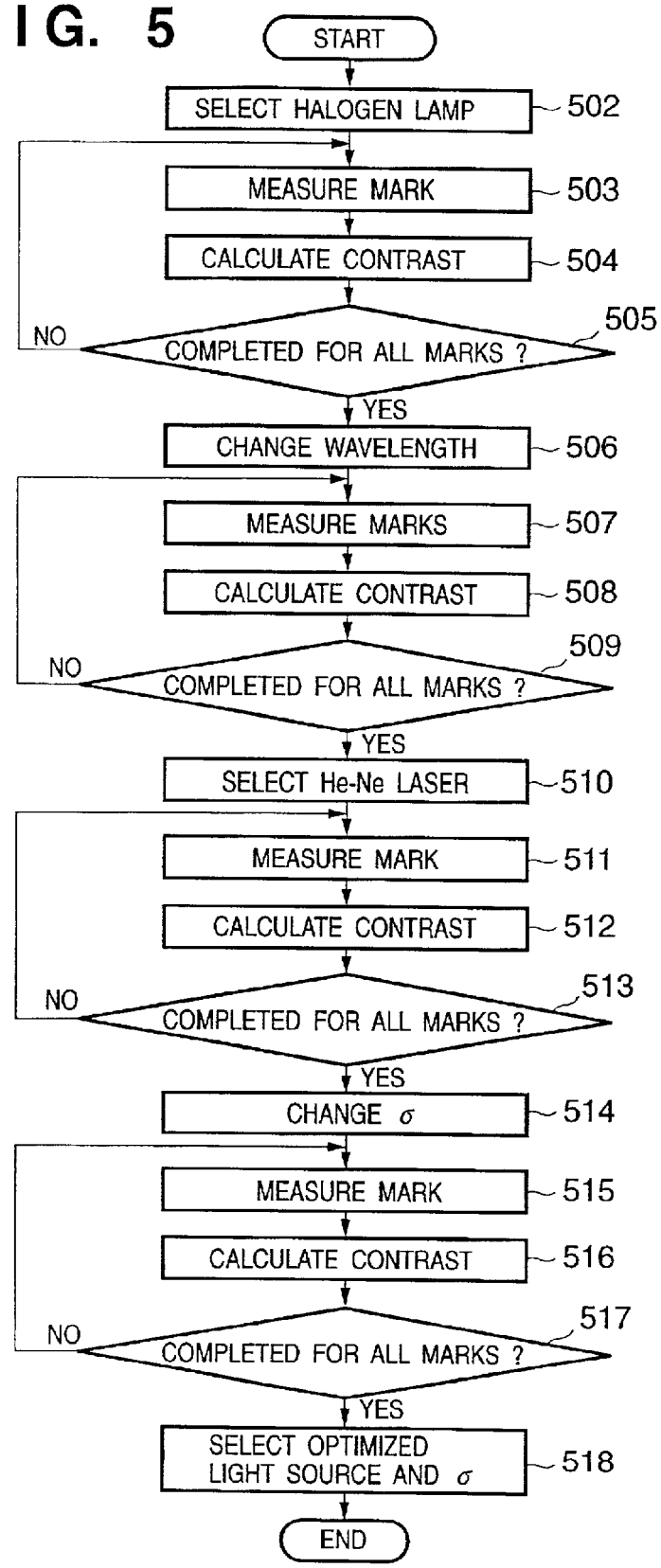
FIG. 5 is a flowchart showing a procedure for determining an optimized measurement condition for each mark.

FIG. 5 is a flowchart showing a process procedure for determining an optimized measurement condition for each mark.

As shown in FIG. 5, a halogen lamp is selected as the light source at step 502, and measurement of an alignment mark is performed with the Off-Axis microscope 7 at step 503, and contrast value is calculated at step 504.

The measurement and contrast calculation are repeated for the alignment marks 11 to 14 at step 505.

Next, the center wavelength of the halogen lamp is varied at step 506, then similar measurement of the alignment marks are performed at step 507. Similar contrast calculation is performed at step 508. The measurement and contrast calculation are repeated for the alignment marks 11 to 14 at step 509.

Steps 510 to 513 are process steps in the case where He—Ne laser light is selected as the alignment light source. After the He—Ne laser is selected at step 510, similar procedure is performed by steps 511 to 513, as performed by steps 503 to 505 described above.

Steps 514 to 517 are process steps in the case where light intensity distribution σ of the He—Ne laser light is varied. After the light intensity distribution σ is varied at step 514, similar procedure is performed by steps 515 to 517, as performed by steps 503 to 505 described above.

At step 518 an optimized measurement condition is determined for each mark from contrast values for varied measurement conditions. The determined measurement condition is held in the lot, and global alignment is conducted with the determined conditions, for each wafer.

The measurement may be automatically performed for each lot with the determined measurement conditions, or the measurement condition may be held as recipe conditions for each lot. In the case of starting the same lot, time for the automatic measurement is reduced by referring to the held measurement conditions.

(Embodiment for semiconductor production system)

An example of a production system for semiconductor devices (semiconductor chips such as IC and LSI, liquid crystal panels, CCDs, thin film magnetic head, micromachines, etc.) by an apparatus according to the present invention will be described. In the system, maintenance services such as trouble management or regular maintenance, or provision of software for manufacturing apparatuses installed in a semiconductor manufacturing factories are provided by using a computer network outside the manufacturing factories.

Figure 8:
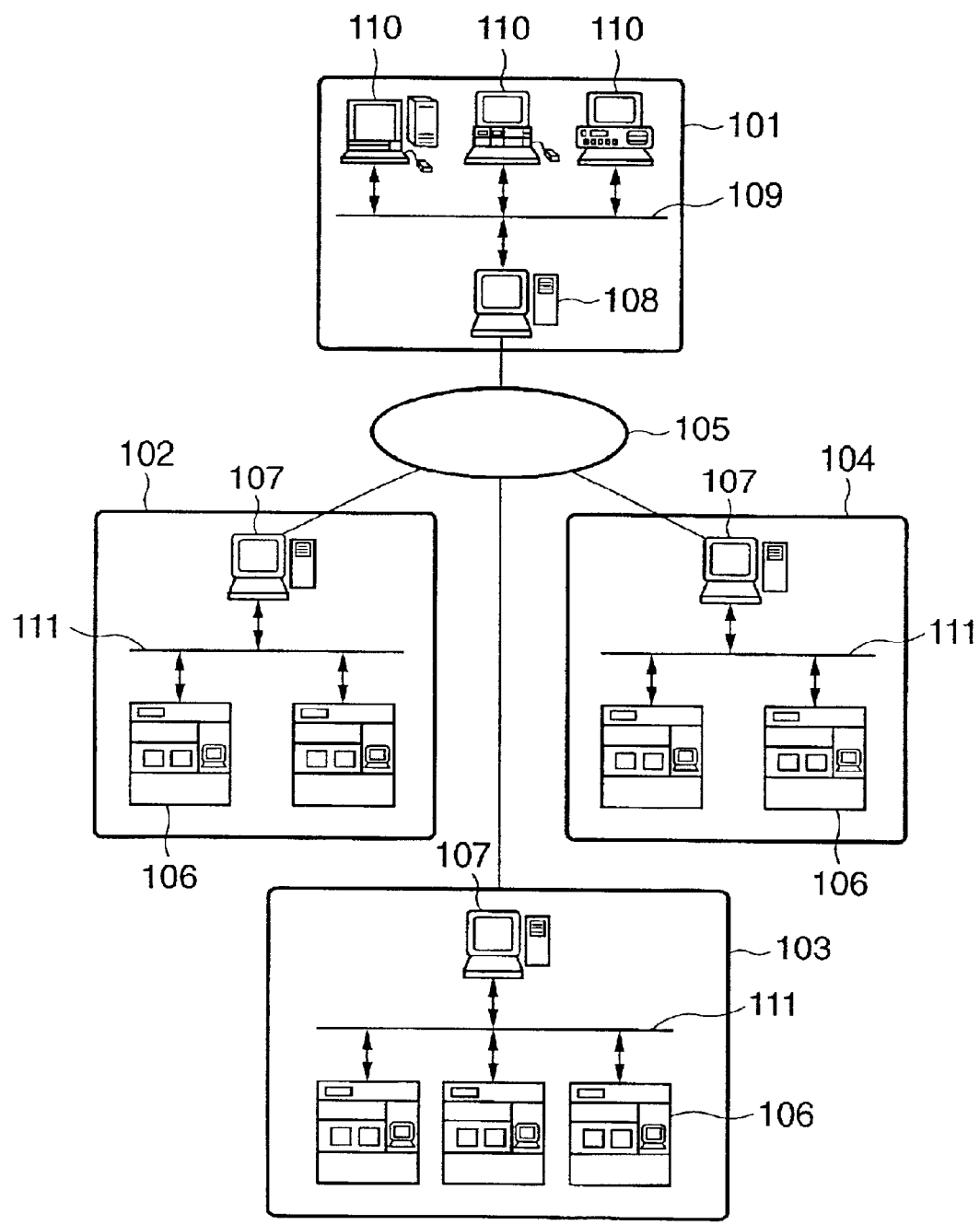
FIG. 8 shows a conceptional view seen from one angle of a production system for semiconductor devices using an apparatus according to the present invention.

FIG. 8 is a representation picked up with a certain angle from the whole system. In the figure, reference numeral 101 denotes an office of a vender (apparatus supplier/manufacturer) providing manufacturing apparatuses for semiconductor devices. It is assumed that the example of manufacturing apparatuses includes semiconductor manufacturing apparatuses for various processes used in semiconductor manufacturing factory, for example, apparatuses for pre-process (lithography apparatuses such as exposure apparatuses, resist process apparatuses, and etching apparatuses, heat treatment apparatuses, film deposition apparatuses, planalization apparatuses, etc.), and apparatuses for post-process (assembly apparatuses, inspection apparatuses, etc.). The office 101 comprises a host management system 108 for providing a maintenance database for manufacturing apparatuses, a plurality of operation terminal computers 110, and a local area network (LAN) 109 to construct an intranet or the like. The host management system 108 comprises a gateway for connecting the LAN 109 to Internet 105 (external network of the office) and a security function to limit accesses from the outside.

Reference numerals 102 to 104 denote manufacturing factories of semiconductor manufacturers as users of the manufacturing apparatuses. The manufacturing factories 102 to 104 may be factories belonging to different manufacturers, or may also be factories belonging to single manufacturer (for example, a factory for pre-process and a factory for post-process). Each of the factories 102 to 103 comprises a plurality of manufacturing apparatuses 106, a local area network (LAN) 111 for connecting them to construct an intranet or the like, and a host management system 107 as a monitor apparatus for monitoring operation status of each manufacturing apparatus 106. The host management system 107 provided in each of the factories 102 to 104 comprises a gateway for connecting LAN 111 in each factory to Internet 105 (external network of the factories). This allows access from LAN 111 via Internet 105 to the host management system 108 in the vender 101's side, and the security function in the host management system 108 allows only predefined user to access it. Specifically, notification from the factory to the vender, of status information representing operation status of each manufacturing apparatus 106 (for example, symptoms of the manufacturing apparatus with trouble occurrence), as well as reception from the vender of response information responding the notification (for example, information for indicating management methods for troubles, software and data for the management for troubles) and maintenance information such as up-to-date software and help information, are possible. For data communication between each of factories 102 to 104 and vender 101 data communication over LAN 111 in each factory, communication protocol (TCP/IP) commonly used in Internet is employed. Instead of utilizing Internet as an external network outside the factory, a dedicated line network (such as ISDN), which tightens security to avoid accessing by a third party, may also be utilized. The host management system is not limited to the one provided by the vender. The user may also construct a database and place it on an external network, and allow access from a plurality of factories of the user to the database.

Figure 9:
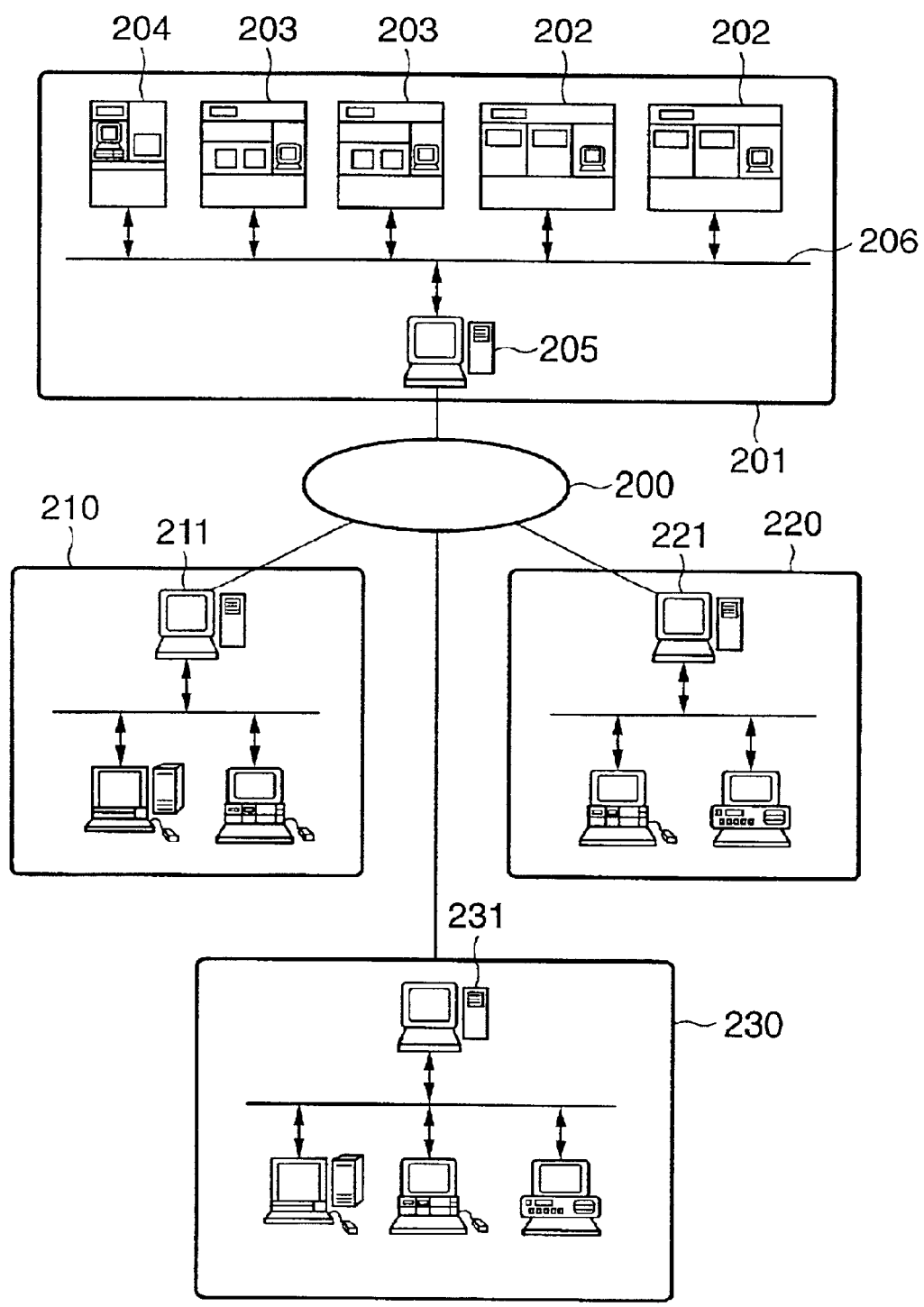
FIG. 9 shows a conceptional view seen from another angle of a production system for semiconductor devices using an apparatus according to the present invention.

FIG. 9 shows a concept representation picked up with a different angle than FIG. 8 from the whole system of this embodiment. In the example described above, the plurality of user factories each having manufacturing apparatuses and the management system of the vender of the manufacturing apparatuses are connected to each other via the external network, and information about production control of each factory and at least one manufacturing apparatus is data-communicated via the external network. On the other hand, in this example, a factory comprising apparatuses from a plurality of venders and a management system of the vender of each of the plurality of manufacturing apparatuses are connected to each other via an external network outside the factory, and maintenance information for each manufacturing apparatus is data-communicated. In the figure, reference numeral 201 denotes a manufacturing factory of a user of manufacturing apparatuses (a semiconductor device manufacturer), a manufacturing line of which is provided with manufacturing apparatuses for performing various processes, for example here, an exposure apparatuses 202, a resist process apparatuses 203, and a film deposition process apparatus 204. While FIG. 9 shows only one manufacturing factory 201, actually multiple factories are connected by network as well. Each apparatus in the factory is connected to the others via LAN 206 to constitute an intranet, and operation management of the manufacturing line is conducted by a host management system 205.

On the other hand, offices of venders (apparatus supplier/manufacturers) such as an exposure apparatus manufacture 210, a resist process apparatus manufacturer 220, and a film deposition apparatus manufacturer 230, have host management systems 211, 221, and 231, respectively, for conducting remote maintenance for the apparatuses supplied by respective manufacturers, and the host management systems comprise respective maintenance database and gateway to an external network, as described above. The host management system 205 for managing each apparatus in the user's manufacturing factory is connected via Internet or a dedicated line network (external network 200) to management systems of vender of apparatuses 211, 221, and 231, respectively. In this system, although upon trouble occurrence in any of the group of apparatuses in the manufacturing line the operation of the manufacturing line stops, quick measure can be implemented by receiving remote maintenance via Internet 200 from the vender of the apparatus with the trouble occurrence, thereby minimizing the stop of the manufacturing line.

Each of the manufacturing apparatus installed in the semiconductor manufacturing factory has a display, a network interface, and a computer for executing network access software and apparatus operation software stored in a storage device. The storage device is such as a built-in memory, hard-disc, or network file sever. The above described network access software includes web browsers for dedicated or general purposes, and provides on its display a user interface with a picture such as one illustrated in FIG. 10, for example. An operator who managing the manufacturing apparatuses in each factory, referring to the picture, inputs information such as machine-type of apparatus 401, serial number 402, title of trouble 403, day of occurrence 404, degree of emergency 405, symptom 406, measure 407, history 408, and so on, into input items on the picture. The input information is transmitted via Internet to the maintenance database, then suitable maintenance information of the result is sent back from the maintenance database to be presented on the display. The user interface provided by the web browser also implements hyperlink functions 410 to 412, as shown in the figure, thereby allowing the operator to access more detailed information on each item, to retrieve up-to-date version software to be used for the manufacturing apparatus from a software library provided by the vender, or to retrieve an operation guide (help information) which is provided for factory operators to refer to. Here, the maintenance information provided by the maintenance database also includes information related to the present invention described above, that is to say, information about suitable measurement conditions for each preformed layer and information about the measurement parts or measurement conditions, and the above described software library also provides up-to-date software for implementing the present invention.

Figure 11:
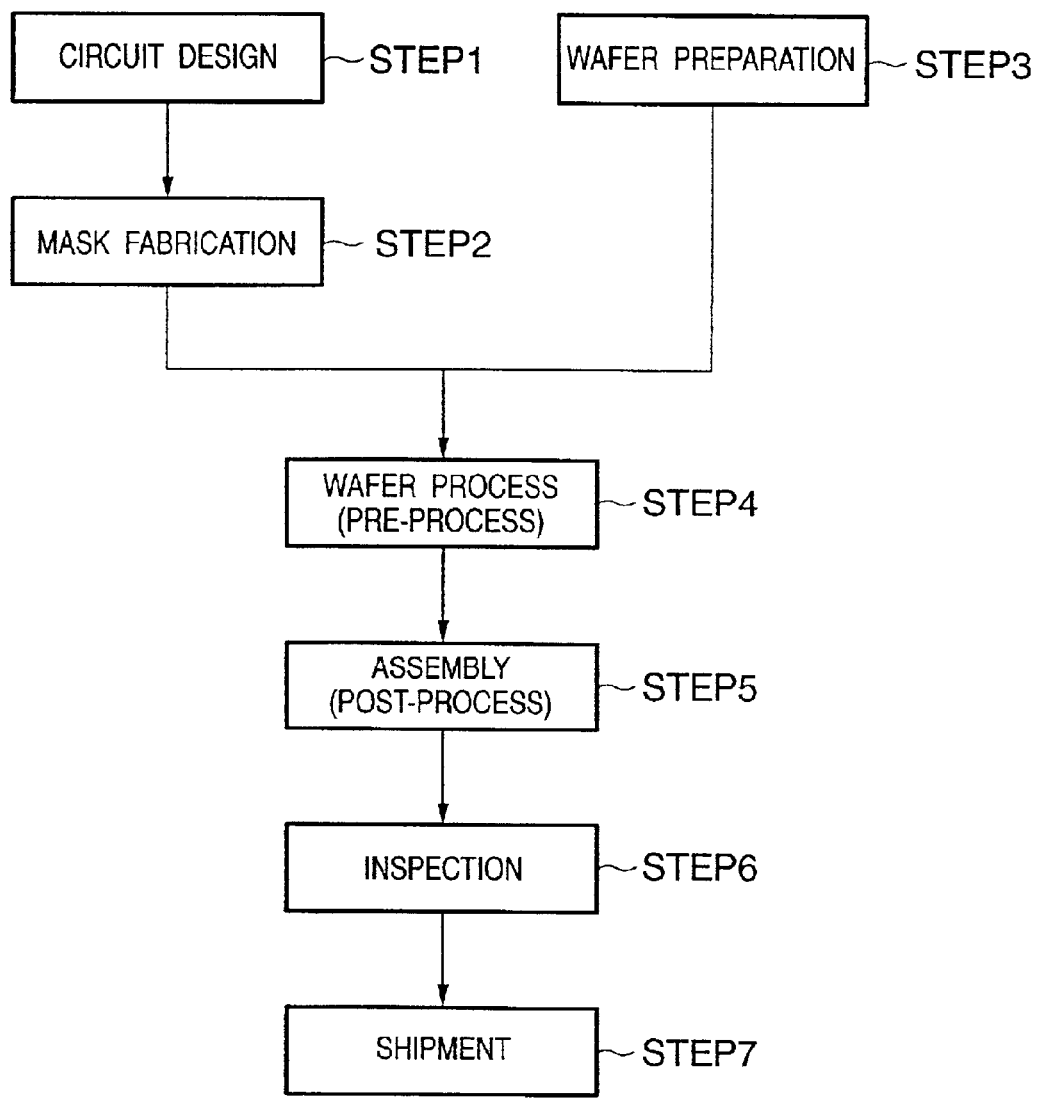
FIG. 11 shows a process flow for manufacturing devices.

A manufacturing process for semiconductor devices utilizing the production system mentioned above will be described. FIG. 11 shows the overall flow of a manufacturing process for semiconductor devices. Circuit design for a semiconductor device is conducted at step 1 (circuit design). Masks with the designed circuit pattern formed thereon are fabricated at step 2 (mask fabrication). On the other hand, wafers are prepared with material such as silicon at step 3 (wafer preparation). Step 4 (wafer process) is referred to as pre-process, and actual circuits are formed on the wafers by lithography technique with the prepared masks described above and the wafers. Next step 5 (assembly) is referred to as post-process, which is a process to forming semiconductor chips by using the wafers fabricated by step 4, and includes processes for assembly such as assembly processes (dicing, bonding), and packaging process (chip encapsulation). At step 6 (inspection), inspections such as performance verification test or durability test for the semiconductor devices fabricated at step 5 are carried out. The semiconductor devices, through those processes, are completed, and then shipped (step 7). The pre-process and post-process are respectively conducted in respective different dedicated factories, and maintenance is performed for each factory by the remote maintenance system described above. Information for production control or apparatus maintenance is also data communicated through Internet or a dedicated line network between the pre-process factory and the post-process factory.

Figure 12:
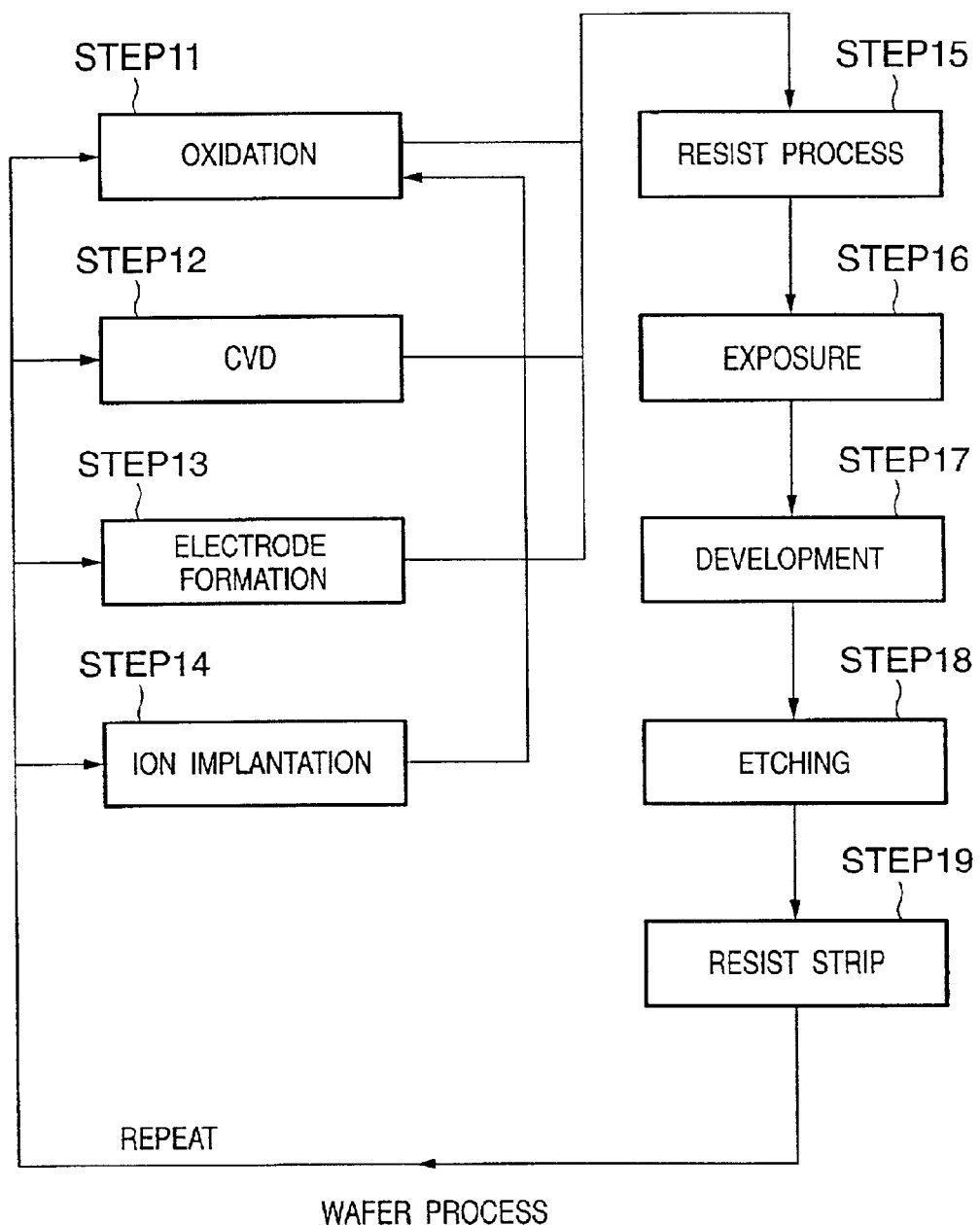
FIG. 12 illustrates a wafer process.

FIG. 12 shows a detailed flow of the above described wafer process. At step 11 (oxidization), a surface of wafer is oxidized. At step 12 (CVD), insulator film is deposited on the wafer surface. At step 13 (electrode formation), electrodes are formed on the wafer surface by evaporation. At step 14 (ion implantation), ions are implanted into the wafer. At step 15 (resist process), photosensitive agent is applied onto the wafer. At step 16 (exposure), the wafer is print-exposed with the circuit pattern on the mask by the above described exposure apparatus. At step 17 (development), the exposed wafer is developed. At step 18 (etching), portions other than the developed resist pattern are etched off. At step 19 (resist strip), resist after etching, which is no longer necessary, is removed. Multiple circuit patterns are formed on the wafer by repeating those steps. Since the manufacturing apparatuses used for each process are maintained by the above described remote maintenance system, troubles are prevented beforehand, and when trouble occurs they can quickly recover their performance, thereby improve productivity for semiconductor devices as compared with conventional ways.

The present invention is not limited to the above embodiments and various changes and modifications can be made within the spirit and scope of the present invention. Therefore, to apprise the public of the scope of the present invention the following claims are made.

What is claimed is:

1. An exposure apparatus for exposing a substrate to a pattern, in which a mark in each of a plurality of layers on the substrate is detected for alignment of the substrate, said apparatus comprising:

a detection system which illuminates a mark in each of a plurality of layers on a substrate and detects an image of the illuminated mark, wherein an illumination condition of said detection system is determined for the mark in each of the plurality of layers based on the detected image.

2. An apparatus according to claim 1, wherein the illumination condition includes at least one of a kind of said detection system, a kind of a light source, a wavelength of light and an intensity distribution of light.

3. An apparatus according to claim 1, wherein the apparatus is arranged such that the illumination condition can be changed manually.

4. An apparatus according to claim 1, wherein said apparatus is arranged such that the image of the illuminated mark in each of the plurality of layers is detected in each of a plurality of illumination conditions, and the illumination condition is determined for the mark in each of the plurality of layers based on the detected images.

5. An apparatus according to claim 4, wherein the illumination condition is determined for the mark in each of the plurality of layers based on a contrast of each of the detected images.

6. An apparatus according to claim 4, wherein the determination is made for each lot of the substrate.

7. A device manufacturing method comprising:

a step of using the exposure apparatus defined in claim 1 to manufacture a device.

* * * * *

UNITED STATES PATENT AND TRADEMARK OFFICE
CERTIFICATE OF CORRECTION

PATENT NO. : 6,838,686 B2
DATED : January 4, 2005
INVENTOR(S) : Yoshiharu Kataoka It is certified that error appears in the above-identified patent and that said Letters Patent is hereby corrected as shown below:

Column 1,
Line 23, "substrate the" should read -- substrate, the --.
Line 56, "characteristic" should read -- characteristic, --.

Column 2,
Line 24, "manufacturing" should read -- manufacturing method --.
Line 25, "a manufac-" should read -- a plurality of manufac- --.
Line 26, "for" should read -- for performing --.
Line 28, "by a" should read -- by performing a --.
Line 40, "vender" should read -- vendor --.
Line 51, "for" should read -- for performing --.
Line 59, "a exposure" should read -- an exposure --.
Line 60, "factory" should read -- factory, -- and "vender" should read -- vendor --.

Column 3,
Line 13, "vender" should read -- vendor --.
Line 32, "in-shot" should read -- an in-shot --.
Lines 52 and 55, "conceptional" should read -- conceptual --.
Line 67, "accompanying" should read -- the accompanying -- and "apart" should read -- a part --.

Column 4,
Line 1, "Such" should read -- Such an --.
Line 13, "apparatus," should read -- apparatuses, --.
Line 15, "Off-Axis" should read -- an Off-Axis --.
Line 17, "non-exposure" should read -- a non-exposure --.
Line 23, "relatively" should read -- a relatively --.
Line 26, "interference" should read -- an interference -- and "resist" should read -- a resist --.
Line 28, "monochromatic" should read -- a monochromatic --.
Lines 29 and 35, "He-Ne" should read -- a He-Ne --.
Line 36, "light" should read -- a light --.
Line 39, "layer each" should read -- layer, each --.
Line 47, "non-exposure" should read -- a non-exposure --.
Line 48, "Off-Axis" should read -- an Off-Axis --.
Line 55, "hold" should read -- held --.
Line 61, "certain" should read -- a certain --.
Line 63, "TTL" should read -- a TTL --.

UNITED STATES PATENT AND TRADEMARK OFFICE
CERTIFICATE OF CORRECTION

PATENT NO. : 6,838,686 B2
DATED : January 4, 2005
INVENTOR(S) : Yoshiharu Kataoka It is certified that error appears in the above-identified patent and that said Letters Patent is hereby corrected as shown below:

Column 5,
Lines 4 and 24, "He-Ne" should read -- a He-Ne --.
Line 12, "again the" should read -- again through the --.
Line 14, "then" should read -- and then --.
Line 22, "certain" should read -- a certain -- and "exposed" should read -- an exposed --.
Line 38, "for" should read -- of --.
Line 45, "arrangement" should read -- an arrangement --.
Line 50, "microscope 7" should read -- microscope 7, -- and "wide" should read -- a wide --.
Line 57, "source" should read -- source, --.
Line 59, "Determination" should read -- A determination --; "if" should read -- of --; and "have" should read -- having --.

Column 6,
Line 3, "after" should read -- wafer -- and "determination" should read -- a determination --.
Line 10, "He-Ne" should read -- a He-Ne -- and "halogen" should read -- a halogen --.
Line 22, "light" should read -- a light --.
Line 24, "change" should read -- to change --.
Line 26, "As" should read -- As in --.
Line 28, "TTL" should read -- the TTL --.
Line 38, "wafer position" should read -- a wafer position, --.
Line 42, "physical feature" should read -- the physical feature --.
Line 44, "resist." should read -- a resist. --.
Line 48, "each marks" should read -- each of the marks --.
Line 49, "automatically" should read -- to automatically --.
Line 53, "same" should read -- the same --.
Line 56, "then" should read -- and then --.
Line 58, "subject" should read -- subjected --.
Lines 59 and 62, "two-dimension" should read -- a two-dimensional --.
Line 63, "one-dimension" should read -- one-dimensional --.
Line 64, "add" should read -- an addition --.

Column 7,
Line 2, "conditions a" should read -- conditions σ --.
Line 11, "contrast" should read -- a contrast --.
Line 15, "then" should read -- and then a --.
Line 16, "Similar" should read -- A similar --.
Line 22, "similar" should read -- a similar --.
Line 25, "light" should read -- a light --.
Line 28, "similar" should read -- a similar --.

UNITED STATES PATENT AND TRADEMARK OFFICE
CERTIFICATE OF CORRECTION

PATENT NO. : 6,838,686 B2
DATED : January 4, 2005
INVENTOR(S) : Yoshiharu Kataoka It is certified that error appears in the above-identified patent and that said Letters Patent is hereby corrected as shown below:

Column 7 (cont'd),
Line 38, "time" should read -- the time --.
Line 41, "semiconductor" should read -- a semiconductor --.
Line 43, "(semiconductor" should read -- (e.g., semiconductor -- and "IC and LSI," should read -- ICs and LSIs, --.
Line 44, "head," should read -- heads, --.
Line 49, "a" should be deleted.
Line 52, "picked up with" should read -- taken at --.
Line 54, "vender (apparatus" should read -- vendor (e.g., an apparatus --.
Line 55, "for" should read -- for manufacturing --.
Line 58, "for" should read -- for performing -- and "in" should read -- in a --.
Line 60, "(lithography" should read -- (e.g., lithography --.
Line 63, "planalization" should read -- planalization --.
Line 64, "(assembly" should read -- (e.g., assembly --.

Column 8,
Line 5, "accesses" should read -- access --.
Line 10, "single" should read -- a single --.
Line 22, "vender 101's" should read -- vendor 101's --.
Line 24, "predefined" should read -- a predefined --.
Line 25, "vender," should read -- vendor, --.
Line 29, "vender" should read -- vendor -- and "responding" should read -- responding to --.
Line 30, the second occurrence of "for" should be deleted.
Line 31, "troubles," should read -- trouble, --.
Line 32, "troubles)" should read -- the trouble) --.
Line 35, "vender 101" should read -- vendor 101 --.
Line 36, "communication" should read -- a communication --.
Lines 37 and 38, "Internet" should read -- the Internet --.
Line 39, "ISDN)," should read -- an ISDN), --.
Line 40, "accessing" should read -- access --.
Line 42, "vender." should read -- vendor. --.
Line 43, "allow" should read -- to allow --.
Line 45, "picked up with" should read -- taken from --.
Line 49, "vender" should read -- vendor --.
Line 55, "venders" should read -- vendors -- and "vender" should read -- vendor --.
Line 61, "(a" should read -- (e.g., a --.
Line 64, "example here, an" should read -- example, here, -- and "a" should be deleted.
Line 67, "actually" should read -- actually, --.

UNITED STATES PATENT AND TRADEMARK OFFICE
CERTIFICATE OF CORRECTION

PATENT NO.    : 6,838,686 B2
DATED         : January 4, 2005
INVENTOR(S)   : Yoshiharu Kataoka It is certified that error appears in the above-identified patent and that said Letters Patent is hereby corrected as shown below:

Column 9,
Line 1, "network" should read -- a network --.
Line 5, "venders (apparatus" should read -- vendors (e.g, apparatus --.
Line 6, "manufacture" should read -- manufacturer --.
Line 12, "respective" should read -- a respective -- and "gateway" should read -- a gateway --.
Line 15, "Internet" should read -- the Internet --.
Line 17, "vender" should read -- a vendor of --.
Line 19, "line" should read -- line, --.
Line 20, "quick" should read -- a quick --.
Line 22, "Internet 200" should read -- the Internet 200 -- and "vender" should read -- vendor --.
Line 23, "stop" should read -- stoppage --.
Line 25, "apparatus" should read -- apparatuses --.
Line 30, "sever." should read -- server. --.
Line 34, "managing" should read -- manages --.
Line 40, "Internet" should read -- the Internet --.
Line 48, "vender," should read -- vendor, --.
Line 49, "information)" should read -- information), --.
Line 59, "for" should read -- for manufacturing --.
Line 62, "semiconductor" should read -- the semiconductor --.
Line 66, "material" should read -- a material --.

Column 10,
Line 1, "pre-process," should read -- a pre-process, --.
Line 2, "technique" should read -- techniques --.
Line 3, "Next step 5" should read -- The next step, step 5 --.
Line 4, "post-process," should read -- a post-process, -- and "forming" should read -- form --.
Line 7, "packaging" should read -- a packaging --.
Line 9, "performance" should read -- a performance -- and "durability" should read -- a durability --.
Line 17, "Internet" should read -- the Internet --.
Line 21, "of wafer" should read -- of a wafer --.
Line 22, "insulator" should read -- an insulator --.
Line 26, "photosensitive" should read -- a photosensitive --.
Line 32, "resist" should read -- a resist --.
Line 37, "troubles" should read -- trouble --.
Line 38, "are" should read -- can be -- and "occurs they" should read -- occurs, performance --.

UNITED STATES PATENT AND TRADEMARK OFFICE
CERTIFICATE OF CORRECTION

PATENT NO. : 6,838,686 B2
DATED : January 4, 2005
INVENTOR(S) : Yoshiharu Kataoka It is certified that error appears in the above-identified patent and that said Letters Patent is hereby corrected as shown below:

Column 10 (cont'd),
Line 39, "recover their performance, thereby improve" should read -- be recovered, thereby improving --.
Line 63, "the" should read -- said --.

Column 12,
Line 4, "the" should read -- an --.

Signed and Sealed this

Thirteenth Day of September, 2005

JON W. DUDAS
*Director of the United States Patent and Trademark Office*